United States Patent [19]

Kozaru et al.

[11] Patent Number: 5,539,691
[45] Date of Patent: Jul. 23, 1996

[54] SEMICONDUCTOR MEMORY DEVICE AND METHOD FOR READING AND WRITING DATA THEREIN

[75] Inventors: Kunihiko Kozaru; Atsushi Ohba, both of Hyogo, Japan

[73] Assignee: Mitsubishi Denki Kabushiki Kaisha, Tokyo, Japan

[21] Appl. No.: 463,254

[22] Filed: Jun. 5, 1995

[30]        Foreign Application Priority Data

Jun. 14, 1994  [JP]   Japan ................................... 6-131714

[51] Int. Cl.⁶ ............................................... G11C 7/00
[52] U.S. Cl. ..................... 365/189.05; 365/190; 365/205
[58] Field of Search ............................. 365/168, 189.01, 365/189.05, 205, 190, 207; 327/51, 57

[56]            References Cited

U.S. PATENT DOCUMENTS 4,730,279   3/1988   Ohtani ............................ 365/190 X
4,876,669  10/1989   Yamamoto et al. ................ 365/189.01
5,295,098   3/1994   Kohno ............................... 365/189.05
5,384,736   1/1995   Jung et al. ...................... 365/189.05 X
5,392,249   2/1995   Kan ................................... 365/190 X

FOREIGN PATENT DOCUMENTS 4-159690   6/1992   Japan .

*Primary Examiner*—David C. Nelms
*Assistant Examiner*—Son Dinh
*Attorney, Agent, or Firm*—Lowe, Price, LeBlanc & Becker

[57]             ABSTRACT

An NAND gate for outputting an output establishment detection signal in response to the fact that a complementary output of a latch type sense amplifier has been established is provided. When a tristate buffer is activated by signal, a word line which has been in a selected state is rendered non-selected state. Accordingly, current can be prevented from leaking from a power supply line to a ground line in tristate buffer. In addition, column current Ic flowing through memory cells can be minimized in response to the fact that word line has been set to a selected state.

7 Claims, 11 Drawing Sheets

SEMICONDUCTOR MEMORY DEVICE AND METHOD FOR READING AND WRITING DATA THEREIN

BACKGROUND OF THE INVENTION

1. Field of the Invention

The present invention relates to a semiconductor memory device and method for reading and writing data therein, and more particularly, to a semiconductor memory device having a plurality of memory cells arranged in row and column directions, a word line corresponding to each memory cell row and a complementary bit line pair corresponding to each memory cell column, and method for reading and writing data therein.

2. Description of the Background Art

FIG. 8 is a block diagram showing an arrangement of a conventional static random access memory (hereinafter referred to as an SRAM). Referring to FIG. 8, this SRAM includes a plurality of memory cells 14a–14d (for simplicity four are shown in FIG. 8) arranged in row and column directions, word lines 13a and 13b corresponding to respective rows, and complementary bit line pairs 15a, 15b and 16a, 16b corresponding to respective columns.

As shown in FIGS. 9(a) and 9(b), memory cell 14a includes driver transistors 61a and 61b, access transistors 62a and 62b, load resistances 63a and 63b, and storage nodes 64a and 64b. Driver transistors 61a and 61b have their drains connected to storage nodes 64a and 64b, their gates connected to storage nodes 64b and 64a, and their sources connected to a ground line 51, respectively. Access transistors 62a and 62b have their sources connected to storage nodes 64a and 64b, their drains connected to bit lines 15a and 15b, and their gates connected to word line 13a, respectively. Load resistances 63a and 63b are each connected to a power supply line 50 at one end and connected to storage nodes 64a and 64b, respectively, at the other end. Other memory cells 14b–14d are similar to memory cell 14a.

This SRAM further includes a row address buffer 2 and a row address decoder 3 for selecting word line 13a or 13b in response to a row address-signal 1, a column address buffer 6 and a column address decoder 7 for selecting bit line pair 15a, 15b or 16a, 16b in response to a column address signal 5, and an address transition sensing circuit 4 for generating a bit line equalizing signal 9, a word line activation signal 10, a sense amplifier activation signal 11 and a latch signal 12 in response to transition of address signals 1 and 5.

This SRAM further includes bit line loads 17a–18b and equalizers 17c and 18c provided on one end of each of bit line pairs 15a, 15b and 16a, 16b, and column select gates 52 provided on the other end of each of bit line pairs 15a, 15b and 16a, 16b. Bit line loads 17a–18b are constituted by P-channel MOS transistors having their sources or drains connected to power supply line 50 or bit lines 15a–16b and their gates connected to ground line 51, respectively. Equalizers 17c and 18c are constituted by P-channel MOS transistors having their sources or drains connected to bit line pairs 15a, 15b and 16a, 16b and their gates receiving bit line equalizing signal 9 from address transition sensing circuit 4.

Column select gate 52 includes transfer gates 19a, 19b and inverter 19c corresponding to bit line pair 15a and 15b, as well as transfer gates 20a, 20b and inverter 20c corresponding to bit line pair 16a and 16b. Transfer gates 19a–20b respectively include a P-channel MOS transistor and an N-channel MOS transistor having their conductive electrodes connected to each other.

Transfer gates 19a and 19b are each connected to bit lines 15a and 15b at one conductive electrode and connected to IO lines 21a and 21b, respectively at the other conductive electrode, and have their gates on the side of the N-channel MOS transistors connected in common and further connected to column address decoder 7 through a column select line 8a. In addition, transfer gates 19a and 19b have their gates on the side of the N-channel MOS transistors connected to their gates on the side of the P-channel MOS transistors through inverter 19c. Transfer gates 20a, 20b and inverter 20c on the side of bit line pair 16a and 16b are similar to those on the side of bit line pair 15a and 15b.

This SRAM further includes a sense circuit 22, an output buffer 24 and an output latch 26. As shown in FIG. 10, sense circuit 22 includes a sense amplifier 70 and a tristate buffer 80. Sense amplifier 70 includes P-channel MOS transistors 71 and 72 constituting a current mirror circuit, N-channel MOS transistors 73 and 74 constituting a differential input circuit, and an N-channel MOS transistor 75 for activating or deactivating these circuits. P-channel MOS transistor 71, N-channel MOS transistors 73 and 75 are connected in series between power supply line 50 and ground line 51, and P-channel MOS transistor 72 and N-channel MOS transistor 74 are connected in series between power supply line 50 and a drain of N-channel MOS transistor 75. P-channel MOS transistors 71 and 72 have their gates connected in common and further connected to a drain of P-channel MOS transistor 71, and N-channel MOS transistors 73 and 74 have their gates connected to IO lines 21a and 21b, respectively, and N-channel MOS transistor 75 has its gate receiving sense amplifier activation signal 11 from address transition sensing circuit 4. A connection node between P-channel MOS transistor 72 and N-channel MOS transistor 74 forms an output node 76.

As shown in FIG. 11, tristate buffer 80 includes P-channel MOS transistors 81 and 82 as well as N-channel MOS transistors 83 and 84 connected in series between power supply line 50 and ground line 51. Transistors 84 and 81 have their gates receiving sense amplifier activation signal 11 and a complementary signal thereof 11, respectively, and transistors 82 and 83 have their gates connected to output node 76 of sense amplifier 70. A connection node 85 of transistors 82 and 83 forms an output node of this tristate buffer 80 and is connected to a read data bus 23.

As shown in FIG. 12, output latch 26 includes a transfer gate 91 and inverters 92–95, and transfer gate 91 includes an N-channel MOS transistor 91a and a P-channel MOS transistor 91b having their conductive electrodes connected to each other. Latch signal 12 from address transition sensing circuit 4 is input to a gate of N-channel MOS transistor 91a, and is also input to a gate of P-channel MOS transistor 91b through inverter 92. Transfer gate 91 has its one conductive electrode connected to read data bus 23, and the other conductive electrode connected to the one conductive electrode through inverters 93 and 95. Inverter 94 is connected between inverter 93 and the other conductive electrode of transfer gate 91.

FIG. 13 is a timing chart showing the operation of the SRAM shown in FIGS. 8–12. Description of read operation of this SRAM will now be given with reference to FIGS. 8–13.

Externally input row address signal 1 is applied to row address buffer 2 for outputting an amplified signal of row address signal 1 and an inverted amplified signal thereof, and an output of row address buffer 2 is applied to row address decoder 3 for decoding a row address signal which is output from row address buffer 2 and to address transition sensing circuit 4.

Meanwhile, externally input column address signal 5 is applied to column address buffer 6 for outputting an amplified signal of column address signal 5 and an inverted amplified signal thereof, and an output of column address buffer 6 is applied to column address decoder 7 for decoding a column address signal which is output from column address buffer 6, and to address transition sensing circuit 4. Column address decoder 7 selects column select line 8a or 8b corresponding to column address signal 5. For example, when column select line 8a is selected, column select line 8a rises to an "H" level as shown in FIG. 13(f), transfer gates 19a and 19b responsively become conductive, and bit line pair 15a and 15b as well as IO line pairs 21a and 21b become conductive.

Address transition sensing circuit 4 generates bit line equalizing signal 9, word line activation signal 10, sense amplifier activation signal 11 and latch signal 12, corresponding to transition of a row address and a column address. Timing of these signals 9–12 is such as shown in FIGS. 13(a)–(e). In response to transition of a row address and a column address, bit line equalizing signal 9 first falls to an "L" level, and then, word line activation signal 10 rises to an "H" level. Sense amplifier activation signal 11 rises to an "H" level in response to rise of word line activation signal 10, and latch signal 12 rises to an "H" level in response to rise of sense amplifier activation signal 11.

Bit line pairs 15a, 15b and 16a, 16b to which memory cells 14a, 14c and 14b and 14d are connected are precharged to a power supply potential by bit line loads 17a, 17b and 18a, 18b, respectively. When bit line equalizing signal 9 falls to an "L" level, equalizers 17c and 18c become conductive and potentials of bit line pairs 15a, 15b and 16a, 16b are equalized.

Row address decoder 3 selects word line 13a or 13b corresponding to row address signal 1 for a period determined by word line activation signal 10. For example, when word line 13a is selected, word line 13a rises to an "H" level as shown in FIG. 13(g), and memory cells 14a and 14b are responsively activated.

Operation of an activated memory cell, for example, 14a will now be described. Assume that a storage node 64a of memory cell 14a is at an "H" level and a storage node 64b thereof is at an "L" level. At this time, one driver transistor 61a of memory cell 14a is not conductive and the other driver transistor 61b is conductive. In addition, since word line 13a is at an "H" level and in a selected state, access transistors 62a and 62b of memory cell 14a are conductive. Accordingly, current flows through a path in the direction of bit line 15b, access transistor 62b, driver transistor 61b and ground line 51 (this current is hereinafter referred to as column current Ic). However, column current Ic does not flow through another path in the direction of bit line 15a, access transistor 62a, driver transistor 61a and ground line 51, since driver transistor 61a is not conductive.

In other words, when storage node 64a of activated memory cell 14a is at an "H" level and storage node 64b thereof is at an "L" level, column current Ic flows from bit line 15b into memory cell 14a and potential of bit line 15b decreases gradually. Similarly, when storage node 64a of activated memory cell 14a is at an "L" level and storage node 64b thereof is at an "H" level, column current Ic flows from bit line 15a into memory cell 14a and potential of bit line 15a decreases gradually. Accordingly, as shown in FIG. 13(h), potential of one of IO line pair 21a and 21b decreases gradually.

As shown in FIG. 10, IO line pair 21a and 21b are connected to gates of input transistors 73 and 74 of sense amplifier 70 of sense circuit 22, respectively. When sense amplifier activation signal 11 output from address transition sensing circuit 4 rises, N-channel MOS transistor 75 of sense amplifier 70 as well as P-channel MOS transistor 81 and N-channel MOS transistor 84 of tristate buffer 80 become conductive, and sense amplifier 70 and tristate buffer 80 are activated simultaneously.

In sense amplifier 70, since N-channel MOS transistor 73 and P-channel MOS transistor 71 are connected in series and P-channel MOS transistor 71 and P-channel MOS transistor 72 constitute a current mirror circuit, current of the same value flows through N-channel MOS transistor 73 and P-channel MOS transistor 72. If potential of IO line 21a is higher than that of IO line 21b, current flowing through N-channel MOS transistor 73 and P-channel MOS transistor 72 is larger than that flowing through N-channel MOS transistor 74, difference current therebetween flows into output node 76, and potential of output node 76 is pulled up. Contrary, if potential of IO line 21a is lower than that of IO line 21b, current flowing through N-channel MOS transistor 73 and P-channel MOS transistor 72 is smaller than that flowing through N-channel MOS transistor 74, difference current therebetween flows from output node 76, and potential of output node 76 is pulled down.

When potential of output node 76 of sense amplifier 70 is pulled up to an "H" level, P-channel MOS transistor 82 of tristate buffer 80 becomes non-conductive and N-channel MOS transistor 83 thereof becomes conductive, current flows from read data bus 23 through N-channel MOS transistors 83 and 84 into ground line 51, and potential of read data bus 23 is pulled down to an "L" level.

Contrary, when potential of output node 76 of sense amplifier 70 is pulled down to an "L" level, P-channel MOS transistor 82 of tristate buffer 80 becomes conductive and N-channel MOS transistor 83 thereof becomes non-conductive, current flows from power supply line 50 through P-channel MOS transistors 81 and 82 into read data bus 23, and potential of read data bus 23 is pulled up to an "H" level as shown in FIG. 13(i).

Output buffer 24 outputs read data signal 25, corresponding to data of read data bus 23. When read data bus 23 becomes attains an "H" level, read data signal 25 which is output from output buffer 24 also attains an "H" level as shown in FIG. 13(j).

When latch signal 12 output from address transition sensing circuit 4 rises, output latch 26 latches data of read data bus 23. In other words, when latch signal 12 rises to an "H" level in output latch 26 shown in FIG. 12, transfer gate 91 becomes conductive. For example, when read data bus 23 is at an "H" level, outputs of inverters 93, 94 and 95 are at an "L" level, an "H" level, and an "H" level, respectively. This state is maintained even if latch signal 10 falls to an "L" level and transfer gate 91 becomes non-conductive. After completion of latching, latch signal 12 becomes inactive. Then, sense amplifier activation signal 11 and word line activation signal 10 fall to an "L" level and read operation is completed.

However, in a conventional SRAM, operating current thereof has been large. In other words, since sense amplifier 70 and tristate buffer 80 are activated simultaneously by sense amplifier activation signal 11 as shown in FIGS. 10 and 11, transistors 81 and 84 of tristate buffer 80 are rendered conductive before potential of output node 76 of sense amplifier 70 is established to an "H" level or an "L" level, and current leaks from power supply line 50 through transistors 81–84 to ground line 51.

In addition, in the conventional SRAM, sense amplifier 70 continuously consumes direct current while sense amplifier activation signal 11 is at an "H" level and N-channel MOS transistor 75 of sense amplifier 70 is conductive.

In the conventional SRAM, word lines 13a and 13b are at an "H" level and column current Ic is consumed throughout data read operation.

SUMMARY OF THE INVENTION

It is a primary object of the present invention to provide a semiconductor memory device which requires small operating current.

Briefly speaking, in a semiconductor memory device in accordance with the present invention, a sensing circuit for sensing that a complementary output of a sense amplifier has been established is provided, and a tristate buffer is activated by an output of the sensing means. Accordingly, unlike in a conventional semiconductor memory device in which a sense amplifier and a tristate buffer are activated simultaneously, current does not leak in a tristate buffer. Consequently, reduction in operating current can be achieved.

Preferably, a sense amplifier is a latch type sense amplifier. Thus, current consumption of a sense amplifier after establishment of an output of the sense amplifier can be prevented, resulting in further reduction in operation current.

Preferably, the sensing means is constituted by an AND circuit which receives a complementary output of a sense amplifier. Thus, the sensing means can be formed easily. Preferably, a read control circuit is provided. Thus, operating current can be significantly reduced. In other words, since the read control circuit sets a word line to a selected state, activates a desired memory cell, writes potential difference corresponding to data of the memory cell to an input node pair of a sense amplifier, and then blocks a transfer gate, load of a sense amplifier can be made quite small. In addition, since the read control circuit sets a word line to a non-selected state in response to an output from a sensing circuit and deactivates a memory cell, column current flowing through a memory cell can be minimized.

Operating current can be reduced by a method for reading data in a semiconductor memory device in accordance with a first aspect of the present invention for the same reason as that in the case where the above-described read control circuit is provided.

Briefly speaking, in a method for reading data in a semiconductor memory device in accordance with a second aspect of the present invention, a word line of a desired row of memory cells is once set to a selected state for a prescribed period and data of each memory cell of the row is temporarily stored in a bit line pair to which each memory cell is connected, and then, the bit line pair is successively connected to a read circuit and data is read continuously. Therefore, data of all the memory cells of one memory cell row is read by setting a word line in a selected state only once, and column current can be significantly reduced compared to a conventional semiconductor memory device in which a word line must be set to a selected state every time data of one memory cell is read, resulting in reduction in operating current of the device.

In a method of writing data in a semiconductor memory device in accordance with the present invention, first, each bit line pair and a write circuit are sequentially connected to each other by a column select gate, data is stored temporarily in each bit line pair, then, a word line of a desired row of memory cells is set to a selected state for a prescribed period, and data is written to each of the memory cells of that row at a time. Therefore, data is written to all the memory cells of one row by setting a word line to a selected state only once, and column current can be significantly reduced compared to a conventional semiconductor memory device in which a word line must be set to a selected state every time data is written to one memory cell, resulting in reduction in operating current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EMBODIMENT 1

Figure 1:
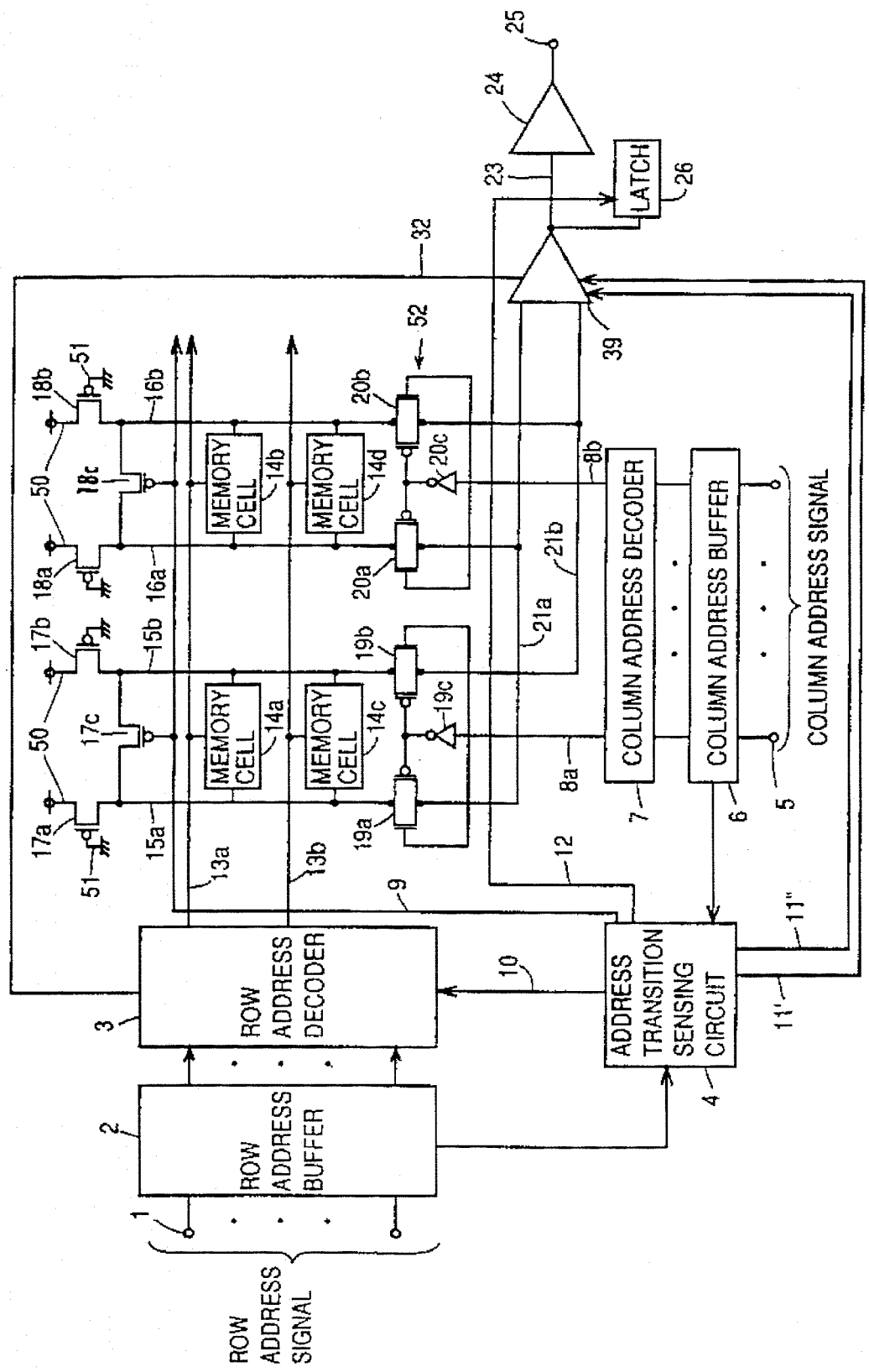
FIG. 1 is a block diagram showing an arrangement of an SRAM in accordance with a first embodiment of the present invention.

FIG. 1 is a block diagram showing an arrangement of an SRAM in accordance with a first embodiment of the present invention. Referring to FIG. 1, this SRAM is different from a conventional SRAM shown in FIG. 8 in that a sense circuit 39 is provided instead of a sense circuit 22 and this sense circuit 39 outputs a signal 32 for detecting establishment of an output of a sense circuit (hereinafter referred to as an output establishment detection signal) to a row address decoder 3, and in that an address transition sensing circuit 4 outputs two sense amplifier activation signals 11' and 11" instead of a sense amplifier signal 11 in order to activate this sense circuit.

Figure 2:
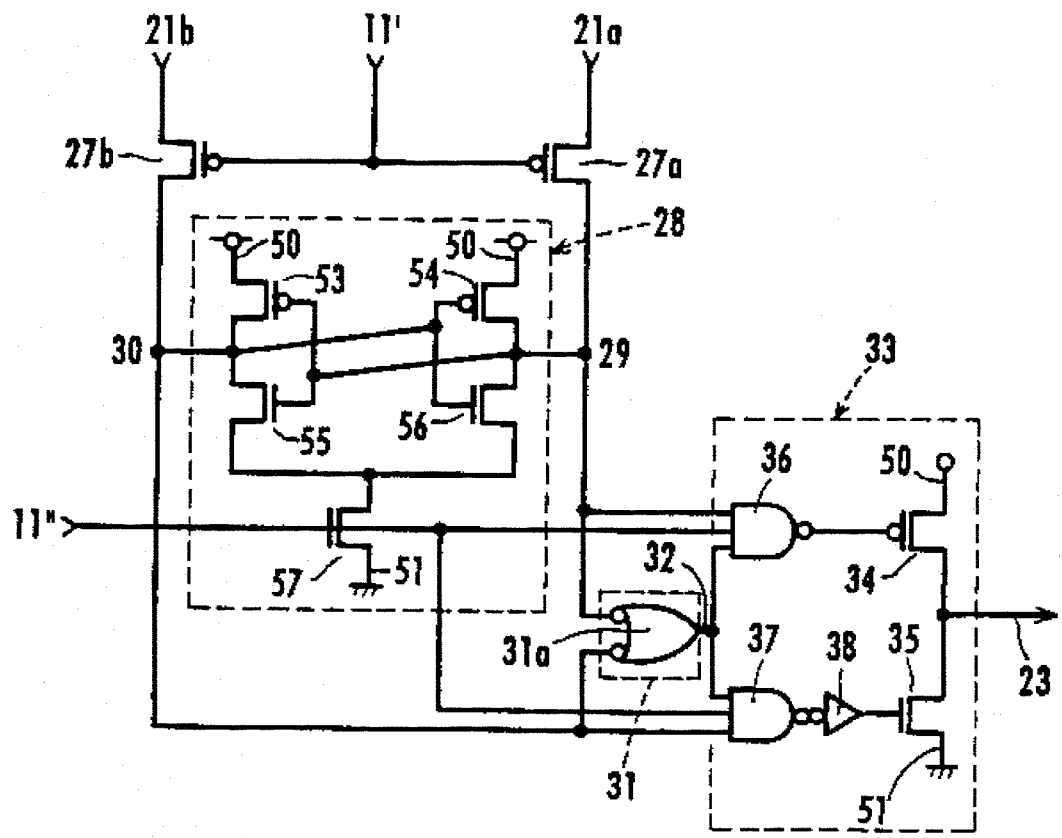
FIG. 2 is a circuit diagram showing an arrangement of a sense circuit of the SRAM shown in FIG. 1.

FIG. 2 is a circuit diagram showing an arrangement of sense circuit 39. Referring to FIG. 2, this sense amplifier 39 includes transfer gates 27a and 27b, a latch type sense amplifier 28, a circuit 31 for generating an output establishment detection signal (hereinafter referred to as an output establishment detection signal generating circuit) and a tristate buffer 33.

Transfer gates 27a and 27b are connected between IO line 21a and I/O node 29 of sense amplifier 28 and between IO line 21b and I/O node 30 of sense amplifier 28, respectively, and are controlled by sense amplifier activation signal 11'. Transfer gates 27a and 27b are respectively constituted by a P-channel MOS transistor with its gate receiving sense amplifier activation signal 11'.

Sense amplifier 28 includes P-channel MOS transistors 53 and 54 as well as N-channel MOS transistors 55–57. P-channel MOS transistor 53 and N-channel MOS transistors 55 and 57 are connected in series between a power supply line 50 and a ground line 51, and P-channel MOS transistor 54 and N-channel MOS transistor 56 are connected in series between power supply line 50 and a drain of N-channel MOS transistor 57. Transistors 53 and 55 have their gates connected in common and further connected to a connection node of transistors 54 and 56. Transistors 54 and 56 have their gates connected in common and further connected to a connection node of transistors 53 and 55. The connection nodes of transistors 54 and 56 as well as transistors 53 and 55 form I/O nodes 29 and 30, respectively. N-channel MOS transistor 57 receives sense amplifier activation signal 11" at its gate.

Output establishment detection signal generating circuit 31 is constituted by a two-input NAND gate 31a, and input nodes of NAND gate 31a are connected to I/O nodes 29 and 30 of sense amplifier 28, respectively.

Tristate buffer 33 includes a P-channel MOS transistor 34, an N-channel MOS transistor 35, three-input NAND gates 36 and 37, and an inverter 38. P-channel MOS transistor 34 and N-channel MOS transistor 35 are connected in series between power supply line 50 and ground line 51, and a connection node of P-channel MOS transistor 34 and N-channel MOS transistor 35 is connected to a read data bus 23. Three input nodes of NAND gate 36 are connected to I/O node 29 of sense amplifier 28, a gate of N-channel MOS transistor 57 of sense amplifier 28, and an output node of NAND gate 31a which constitutes output establishment detection signal generating circuit 31, respectively, and an output node of NAND gate 36 is connected to a gate of P-channel MOS transistor 34. Three input nodes of NAND gate 37 are connected to I/0 node 30 of sense amplifier 28, a gate of N-channel MOS transistor 57 of sense amplifier 28, and an output node of NAND gate 31a which constitute output establishment detection signal generating circuit 31, respectively, and an output node of NAND gate 37 is connected to a gate of N-channel MOS transistor 35 through inverter 38.

Figure 8:
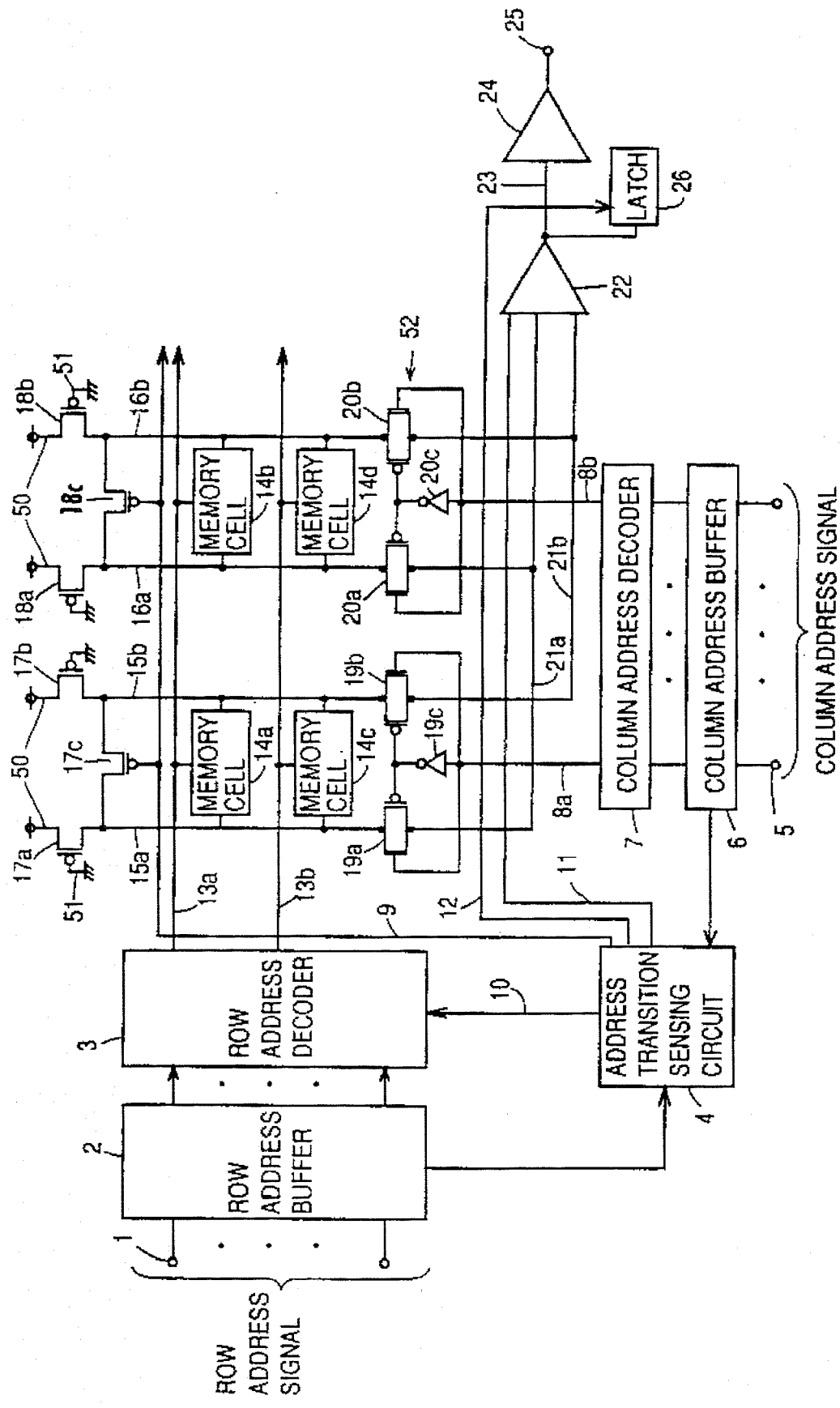
FIG. 8 is a block diagram showing an arrangement of a conventional SRAM.
Figure 9A:
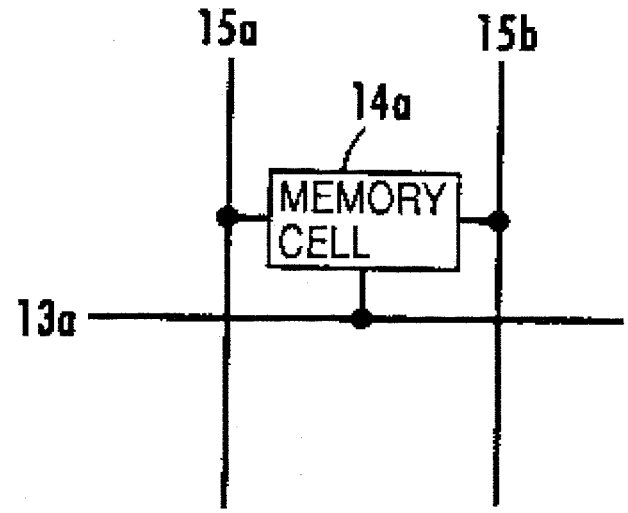
FIGS. 9(a) to 9(b) are circuit diagrams showing an arrangement of a memory cell of the SRAM shown in FIG. 8.
Figure 9A:
Figure 9B:
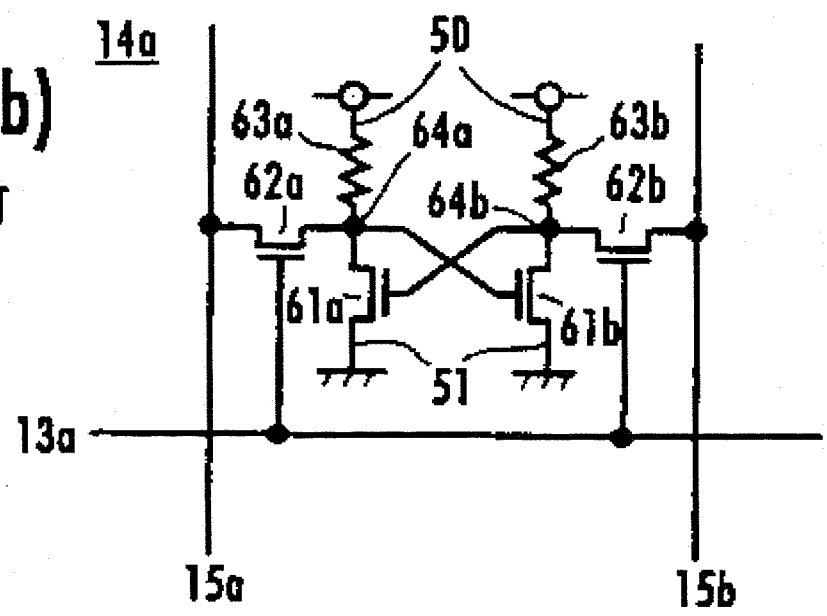
Figure 10:
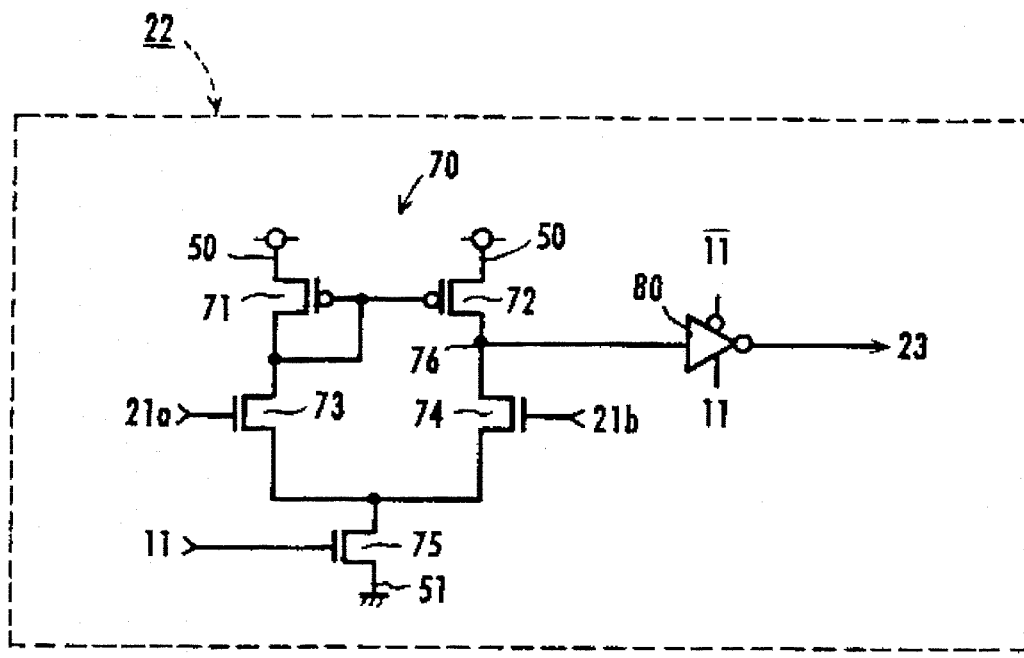
FIG. 10 is a circuit diagram showing an arrangement of a sense circuit of the SRAM shown in FIG. 8.
Figure 11:
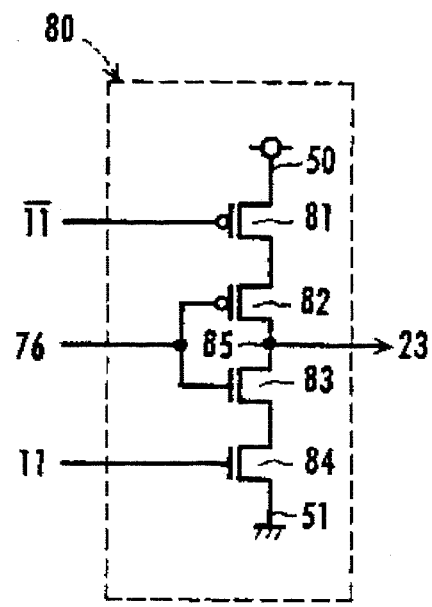
FIG. 11 is a circuit diagram showing an arrangement of a tristate buffer of the sense circuit shown in FIG. 10.
Figure 12:
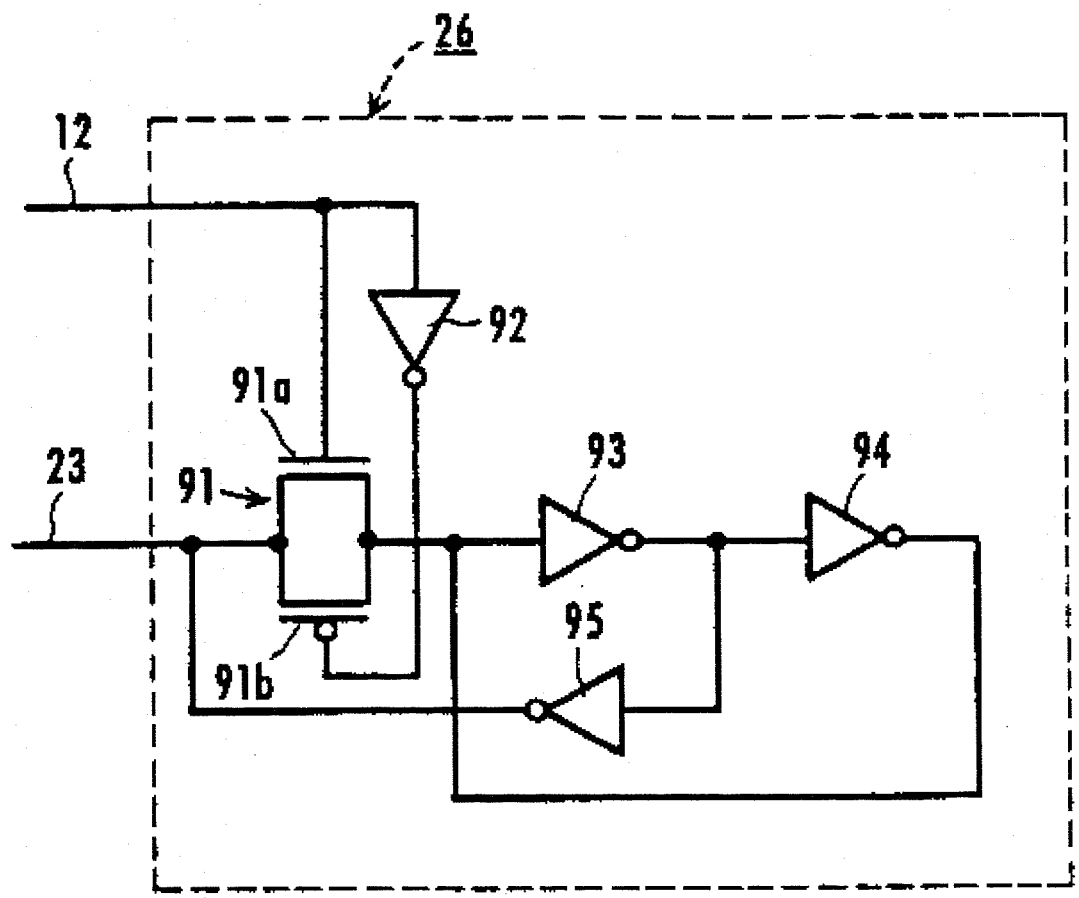
FIG. 12 is a circuit diagram showing an arrangement of an output latch of the SRAM shown in FIG. 8.
Figure 13:
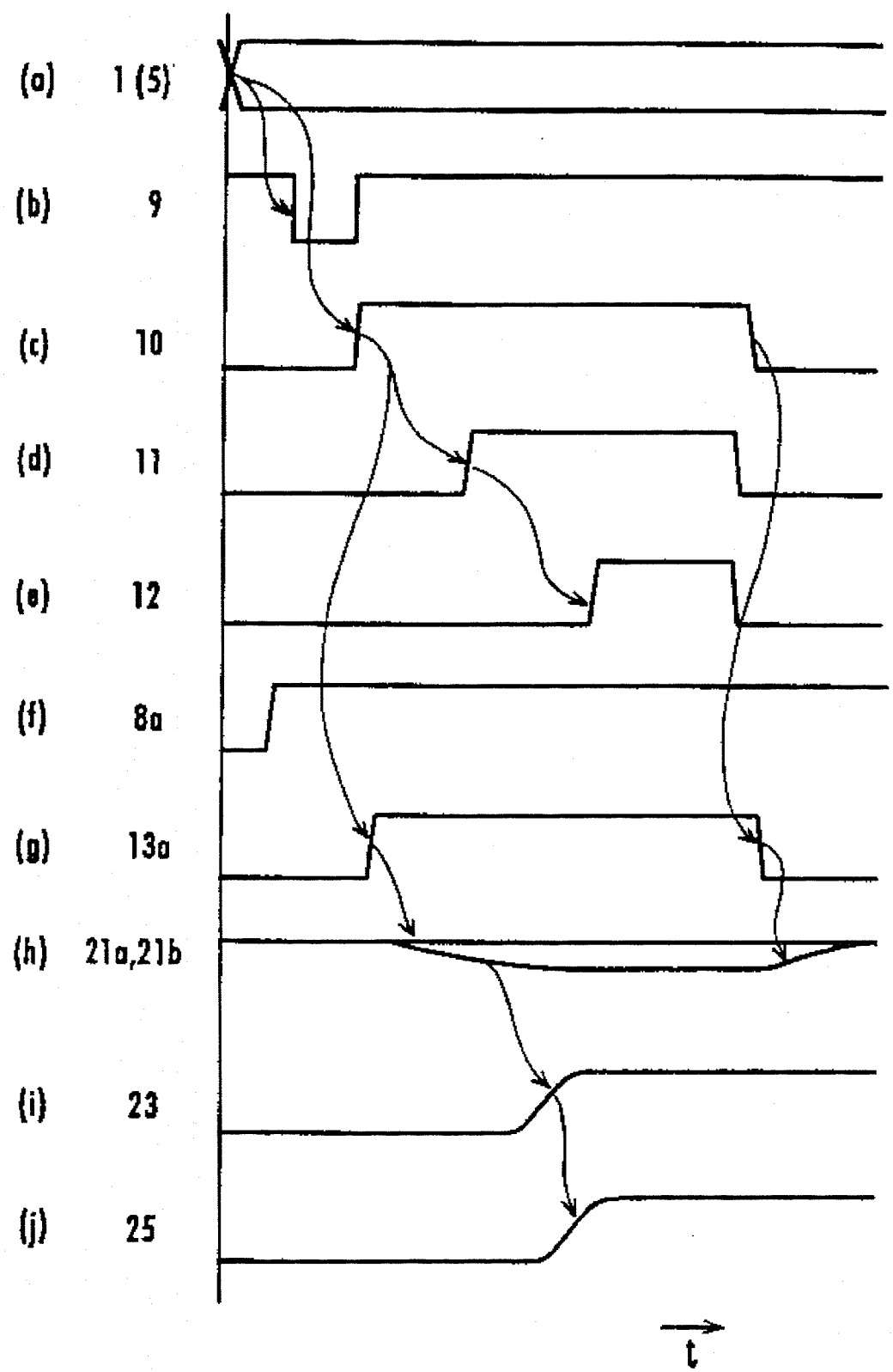
FIGS. 13(a) to 13(j) timing charts showing read operation of the SRAM shown in FIG. 8.

Since other arrangement is similar to that of the SRAM shown in FIG. 8, description thereof will not be repeated.

Figure 3:
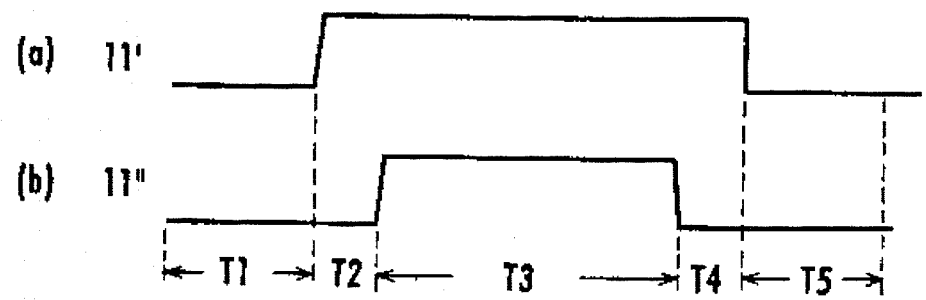
FIGS. 3(a) and (b) are timing charts of a sense amplifier activation signal for activating the sense circuit shown in FIG. 2.

FIG. 3 is a timing chart of sense amplifier activation signals 11' and 11" for activating sense circuit 39 shown in FIG. 2. First, detailed description of read operation of this sense circuit 39 will be given with reference to FIGS. 2 and 3.

Sense amplifier activation signal 11' is at an "L" level for a period T1, at an "H" level for periods T2–T4, and at an "L" level for a period T5, as shown in FIG. 3(*a*). Sense amplifier activation signal 11" is at an "L" level for periods T1 and T2, at an "H" level for a period T3, and at an "L" level for periods T4 and T5, as shown in FIG. 3(*b*).

For period T1, since sense amplifier activation signals 11' and 11" are both at an "L" level, transfer gates 27a and 27b are both conductive and potentials of IO line pair 21a and 21b are input to I/O node pair 29 and 30. Since sense amplifier activation signal 11" is at an "L" level, N-channel MOS transistor 57 of sense amplifier 28 is not conductive, and sense amplifier 28 is inactive. At this time, since the gate of P-channel MOS transistor 34 of tristate buffer 33 rises to an "H" level and the gate of N-channel MOS transistor 35 of tristate buffer 33 falls to an "L" level, output of tristate buffer 33 is "Hi-Z".

For period T2, sense amplifier activation signal 11' rises to an "H" level and transfer gates 27a and 27b become non-conductive. Thus, IO line pair 21a and 21b are disconnected from I/O node pair 29 and 30 of sense amplifier 28, and load of sense amplifier 28 is reduced, resulting in improvement in the speed of sensing operation. Since sense amplifier activation signal 11" is at an "L" level, an output of tristate buffer 33 is "Hi-Z" just as for period T1.

For period T3, since sense amplifier activation signals 11' and 11" are both at an "H" level, sense amplifier 28 is activated and it amplifies potential difference between I/O node pair 29 and 30. When potential of either I/O node 29 or 30 exceeds threshold of NAND gate 31a, output establishment detection signal 32 which is output from NAND gate 31a rises to an "H" level. Thus, if potential of I/O node 29 is at an "H" level, the gate of P-channel MOS transistor 34 falls to an "L" level and current flows from power supply line 50 through P-channel MOS transistor 34 to read data bus 23 and read data bus 23 is pulled up to an "H" level. Contrary, if potential of I/O node 30 is at an "H" level, the gate of N-channel MOS transistor 35 rises to an "H" level, current flows from read data bus 23 through N-channel MOS transistor 35 to ground line 51 and read data bus is pulled down to an "L" level.

Since latch type sense amplifier 28 does not consume direct current after an output thereof has been established, current consumption can be reduced. In other words, when I/O node 30 is at an "H" level and I/O node 29 is at an "L" level, P-channel MOS transistor 54 and N-channel MOS transistor 55 are non-conductive, and when I/O node 30 is at an "L" level and I/O node 29 is at an "H" level, P-channel MOS transistor 53 and N-channel MOS transistor 56 are non-conductive, and therefore, direct current does not flow from power supply line 50 to ground line 51. In addition, since tristate buffer 33 is controlled by output establishment detection signal 32, P-channel MOS transistor 34 and N-channel MOS transistor 35 do not become conductive simultaneously, current does not leak from power supply line 50 through transistors 34 and 35 into ground line 51.

For period T4, since sense amplifier activation signal 11" again falls to an "L" level, an output of tristate buffer 33 is "Hi-Z".

For period T5, sense amplifier activation signal 11" also fall to an "L" level, transfer gates 27a and 27b becomes conductive, and I/O node pair 29 and 30 of sense amplifier 28 are again connected to IO line pair 21a and 21b.

Figure 4:
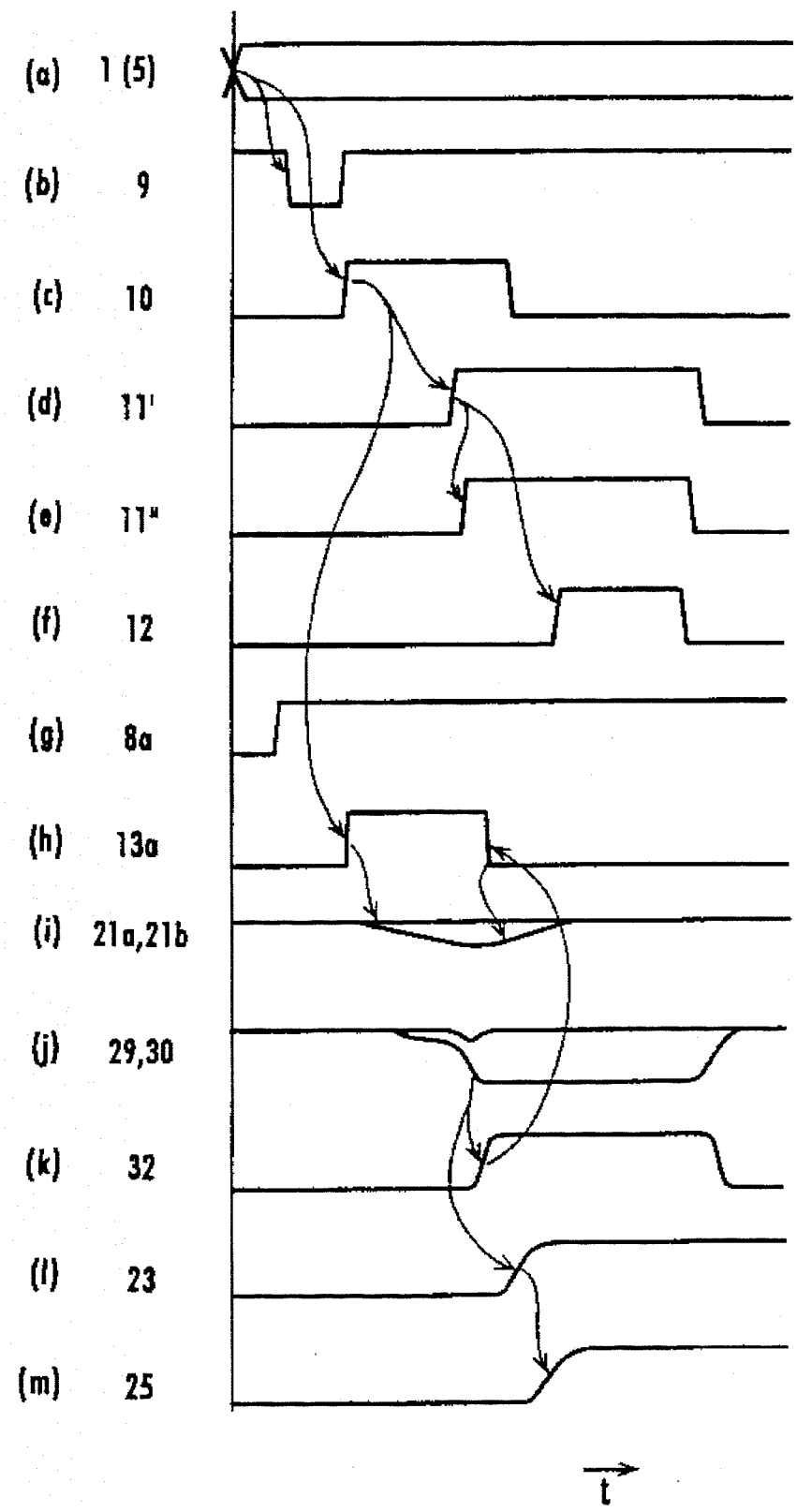
FIGS. 4(a) to 4(m) are timing charts showing data read operation of the SRAM shown in FIG. 1.

FIG. 4 is a timing chart showing operation of the SRAM shown in FIGS. 1 and 2. Description of read operation of the SRAM will now be given with reference to FIGS. 1–4.

Externally input row address signal 1 is applied to a row address buffer 2 for outputting an amplified signal and an inverted amplified signal of row address signal 1, and an output of row address buffer 2 is applied to a row address decoder 3 for decoding a row address signal output from row address buffer 2 and to address transition sensing circuit 4.

Meanwhile, externally input column address signal 5 is applied to a column address buffer 6 for outputting an amplified signal and an inverted amplified signal of column address signal 5, and an output of column address buffer 6 is applied to a column address decoder 7 for decoding a column address signal output from column address buffer 6 and to address transition sensing circuit 4. Column address decoder 7 selects a column select line 8a or 8b corresponding to column address signal 5. For example, when column select line 8a is selected, column select line 8a rises to an "H" level as shown in FIG. 4(g), transfer gates 19a and 19b responsively become conductive, and bit line pair 15a and 15b as well as IO line pair 21a and 21b become conductive.

Address transition sensing circuit 4 generates a bit line equalizing signal 9, a word line activation signal 10, sense amplifier activation signals 11' and 11", and a latch signal 12, corresponding to transition of a row address and a column address. Timing of signals 9–12 is such as shown in FIG. 4(a)–(f). In response to transition of a row address and a column address, bit line equalizing signal 9 first falls to an "L" level and word line activation signal 10 then rises to an "H" level. Sense amplifier activation signal 11' rises to an "H" level in response to rise of word line activation signal 10, and sense amplifier activation signal 11" and latch signal 12 rise to an "H" level in response to rise of sense amplifier activation signal 11'.

Bit line pairs 15a, 15b and 16a, 16b to which memory cells 14a, 14c and 14b, 14d are connected are precharged to power supply potential by bit line loads 17a, 17b and 18a, 18b, respectively. When bit line equalizing signal 9 falls to an "L" level, equalizers 17c and 18c become conductive and potentials of bit line pairs 15a, 15b and 16a, 16b are equalized.

Row address decoder 3 selects word line 13a or 13b corresponding to row address signal 1 for a period determined by word line activation signal 10. For example, when word line 13a is selected, word line 13a rises to an "H" level as shown in FIG. 4(h) and memory cells 14a and 14b are responsively activated.

When memory cells 14a and 14b are activated, current Ic flows into memory cells 14a and 14b from one of bit line loads 17a and 17b as well as one of bit line loads 18a and 18b, which are connected to memory cells 14a and 14b on the side of a storage node at an "L" level, respectively. Thus, potentials of one of bit lines 15a and 15b as well as one of bit lines 16a and 16b begin to decrease gradually. Accordingly, potential of one of IO lines 21a and 21b also begins to decrease gradually.

IO line pair 21a and 21b are connected to inputs of sense circuit 39, respectively. When sense amplifier activation signal 11' output from address transition sensing circuit 4 rises with potential difference between IO line pair 21a and 21b being large enough, I/O node pair 29 and 30 of sense amplifier 28 are disconnected from IO line pair 21a and 21b.

Then, when sense amplifier activation signal 11" rises, sense amplifier 28 begins to amplify potential difference between I/O node pair 29 and 30. Thus, when potential of either I/O node 29 or 30 exceeds threshold of an "L" level, NAND gate 31a outputs output establishment detection signal 32. When output establishment detection signal 32 rises to an "H" level, tristate buffer 33 comes to be ready for output, and outputs data corresponding to read data to read data bus 23. Meanwhile, output establishment detection signal 32 is input to row address decoder 3 and used to cause word lines 13a and 13b to fall. Thus, period during which word lines 13a and 13b are active can be minimized, resulting in reduction in column current Ic.

An output buffer 24 outputs a read data signal 25 corresponding to data of read data bus 23.

When latch signal 12 output from address transition sensing circuit 4 rises, an output latch 24 latches data of read data bus 23. Upon completion of latching, latch signal 12 falls to an "L" level. Then, sense amplifier activation signal 11" and 11' fall to an "L" level in this order and read operation is completed.

In this embodiment, since latch type sense amplifier 39 is provided, sense amplifier 39 does not consume direct current after an output of sense amplifier 39 has been established. In addition, since word lines 13a and 13b are caused to fall by output establishment detection signal 32, period during which word lines 13a and 13b are active can be minimized and column current Ic can be reduced, resulting in reduction in current consumption of the SRAM.

EMBODIMENT 2

Figure 5:
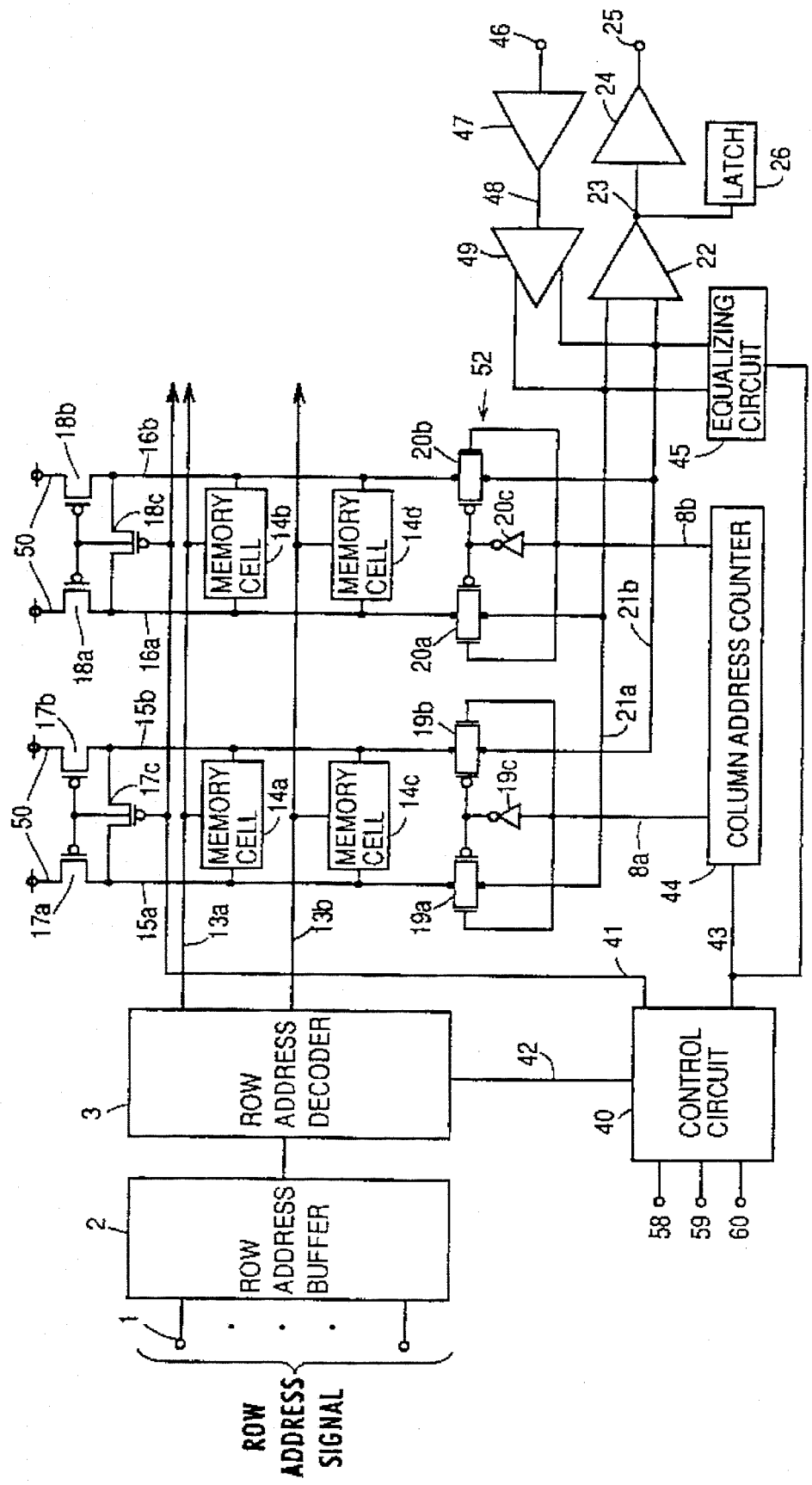
FIG. 5 is a block diagram showing an arrangement of an SRAM in accordance with a second embodiment of the present invention.
Figure 6:
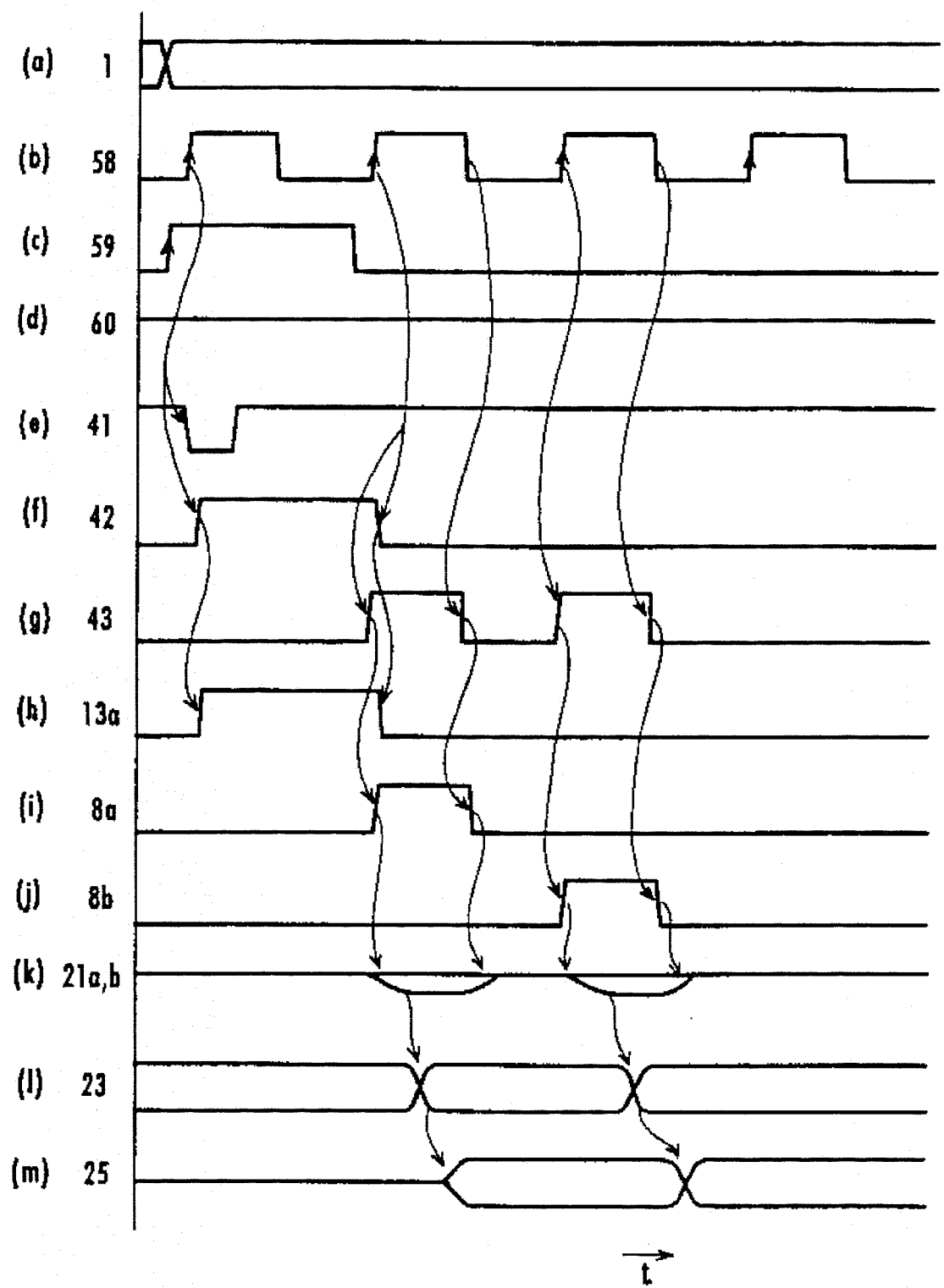
FIGS. 6 (a) to 6(m) timing charts showing continuous data read operation of the SRAM shown in FIG. 5.
Figure 7:
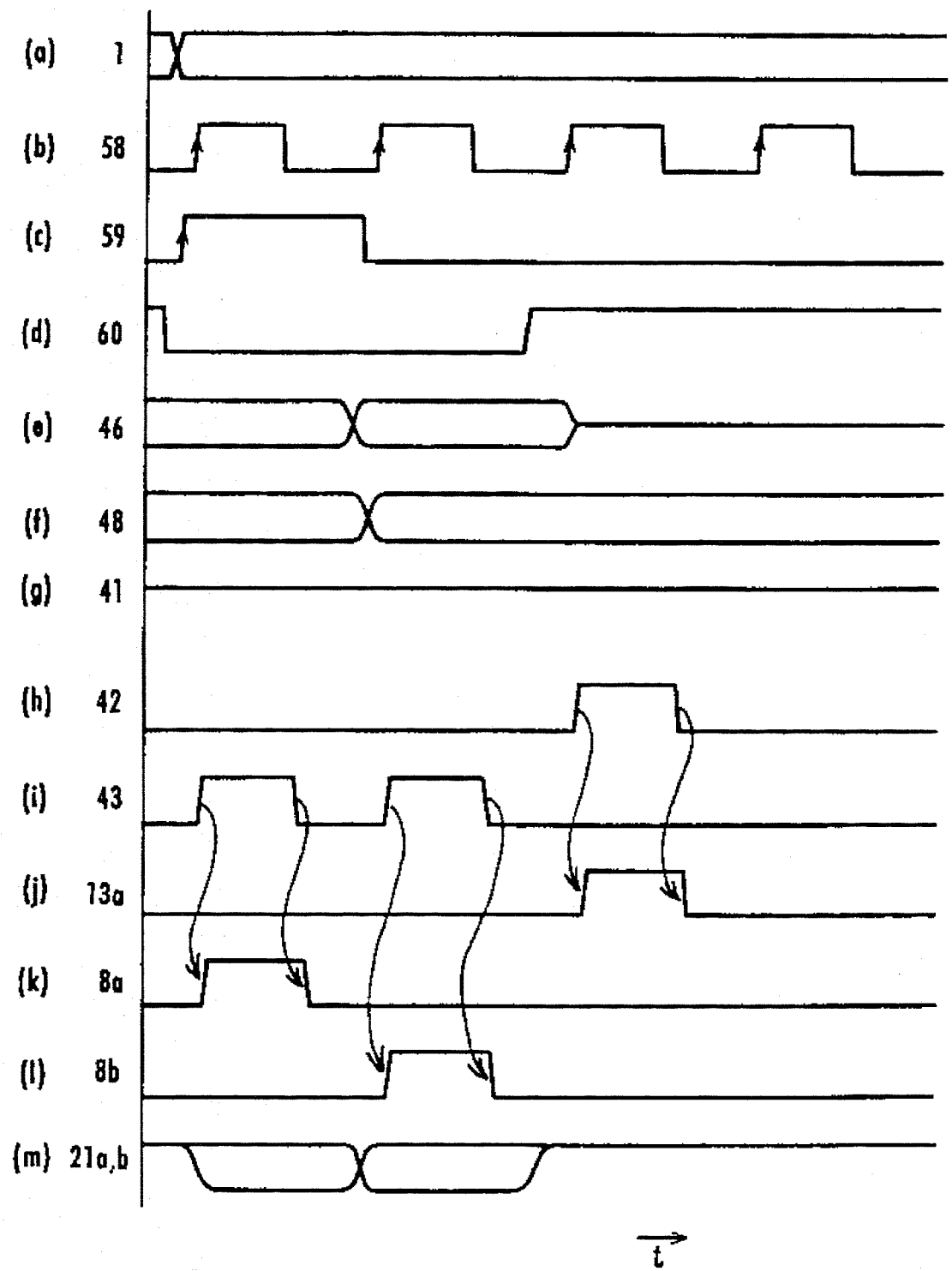
FIGS. 7(a) to 7(m) are timing charts showing continuous data write operation of the SRAM shown in FIG. 5.

FIG. 5 is a block diagram showing an arrangement of an SRAM in accordance with a second embodiment of the present invention, and FIGS. 6 and 7 are timing charts showing read and write operations of the SRAM shown in FIG. 5, respectively.

In this embodiment, externally synchronized continuous read operation (burst read) and continuous write operation (burst write) with small power consumption will be described. Although 2-bit continuous read and write operations will be described for convenience in this embodiment, increase in the number of columns will enable further continuous read and write operations.

First, an arrangement of this SRAM will be described. Referring to FIG. 5, this SRAM is different from the conventional SRAM shown in FIG. 8 in that a control circuit 40 and a column address counter 44 are provided instead of an address transition sensing circuit 4, a column address buffer 6 and a column address decoder 7, and in that gates of P-channel MOS transistors constituting bit line loads 17a, 17b and 18a, 18b are connected in common to gates of P-channel MOS transistors constituting equalizers 17c and 18c, respectively, instead of being connected to a ground line 51. This SRAM includes an equalizing circuit 45 for equalizing potentials of IO line pair 21a and 21b, and an input buffer 47 and a write driver 49 for writing data to memory cells 14a–14d. Since other arrangement of this SRAM is similar to that of the SRAM shown in FIG. 8, description thereof will not be repeated.

Continuous read operation of this SRAM will now be described with reference to FIGS. 5 and 6. Externally input row address signal 1 is applied to a row address buffer 2 for outputting an amplified signal and an inverted amplified signal thereof. An output of row address buffer 2 is applied to a row address decoder 3 for decoding a row address signal output from row address buffer 2.

Row address signal 1 is valid when an address strobe signal 59 is at an "H" level at a rising edge of an externally input external clock signal 58.

A write enable signal 60 is a signal for indicating read operation when it is at an "H" level and write operation at an "L" level, and in this case, signal 60 is fixed to an "H" level.

Control circuit 40 generates a bit line precharge signal 41, a word line activation signal 42 and a column selection control signal 43 in response to inputs of external clock signal 58, address strobe signal 59 and write enable signal 60.

When bit line precharge signal 41 falls to an "L" level, bit line pairs 15a, 15b and 16a, 16b are precharged to power supply potential. However, when bit line precharge signal 41 rises to an "H" level, bit line loads 17a, 17b and 18a, 18b are off, and therefore, bit line pairs 15a, 15b and 16a, 16b are set to a floating state.

Row address decoder 3 selects word line 13a or 13b corresponding to row address signal 1 while word line activation signal 42 is at an "H" level.

Assume that word line 13a is selected, for explanation. When word line 13a rises to an "H" level, memory cells 14a and 14b are activated, and potentials of either bit line 15a or 15b and either bit line 16a or 16b is decreased rapidly by data of memory cells 14a and 14b, and therefore, potential difference between bit lines becomes large.

It is noted that since potentials of bit line pairs 15a, 15b and 16a, 16b on the side of an "L" level decrease to ground potential if word line 13a is kept in a selected state for a long time, bit lines 15–16b may be clamped, for example, by a diode-connected N-channel MOS transistor. In this case, potential of a bit line on the side of an "L" level decreases only by threshold voltage of the N-channel MOS transistor from power supply potential.

When a prescribed potential difference between two bit lines is obtained, word line 13a falls to an "L" level. Since bit line loads 17a, 17b and 18a, 18b are non-conductive even if word line 13a falls to an "L" level, potential difference between bit lines can be held as it has been, so long as leakage is not considered. In this case, it can be considered that data of memory cells 14a and 14b are stored temporarily in bit line pairs 15a, 15b and 16a, 16b, respectively.

Column address counter 44 successively selects column select lines 8a and 8b in response to column select control signal 43. When column select line 8a rises to an "H" level, transfer gates 19a and 19b are both conductive, and bit line pair 15a and 15b and IO line pair 21a and 21b are connected to each other. Thus, potential difference between bit line pair 15a and 15b is transmitted to IO line pair 21a and 21b.

Sense amplifier 22 amplifies potential difference between IO line pair 21a and 21b and outputs data to read data bus 23. Output buffer 24 outputs a read data signal 25 corresponding to data of read data bus 23. Output latch 26 latches data of read data bus 23 at appropriate timing.

When column select control signal 43 falls to an "L" level, column select line 8a is set in a non-selected state, and bit line pair 15a and 15b and IO line pair 21a and 21b are not connected to each other.

When column select control signal 43 falls to an "L" level, an equalizing circuit 45 precharges and equalizes potentials of IO line pair 21a and 21b to power supply potential.

When column select control signal 43 rises to an "H" level, column address counter 44 selects column select line 8b. When column select line 8b rises to an "H" level, transfer gates 20a and 20b both become conductive, and bit line pair 16a and 16b are connected to each other. Thus, potential difference between bit line pair 16a and 16b is transmitted to IO line pair 21a and 21b.

Sense amplifier 22 amplifies potential difference between IO line pair 21a and 21b, and outputs data to read data bus 23. Output buffer 24 outputs read data signal 25 corresponding to data of read data bus 23. Output latch 26 latches data of read data bus 23 at appropriate timing.

When column select control signal 43 falls to an "L" level, column select line 8b is set to a non-selected state, transfer gates 20a and 20b become non-conductive, and bit line pair 16a and 16b and IO line pair 21a and 21b are not connected to each other. When column select control signal 43 falls to an "L" level, equalizing circuit 45 precharges potentials of IO line pair 21a and 21b to power supply potential.

Although 2-bit continuous read operation has been described, increase in the number of columns will enable further continuous read operation.

In continuous read operation which has been described above, since word line 13a rises only once, column current Ic can be significantly reduced, resulting in reduction in operating current of the SRAM.

Continuous write operation of this SRAM will now be described with reference to FIGS. 5 and 7. Externally input row address signal 1 is applied to row address buffer 2 for outputting an amplified signal and an inverted amplified signal of row address signal 1. An output of row address buffer 2 is applied to row address decoder 3 for decoding a row address signal output from row address buffer 2.

Row address signal 1 is valid when address strobe signal 59 is at an "H" level at a rising edge of externally input external clock signal 58.

Write enable signal 60 is a signal for indicating read operation when it is at an "H" level and write operation at an "L" level, and in this case, pulse of an "L" level is input.

If write enable signal 60 is at an "L" level at a rising edge of external clock signal 58, write data input 46 is taken into input buffer 47. Input buffer 47 outputs write data to write data bus 48.

Control circuit 40 generates bit line precharge signal 41, word line activation signal 42 and column select control signal 43 in response to inputs of external clock signal 58, address strobe signal 59 and write enable signal 60. In the case of write operation, bit line precharge signal 41 is fixed at an "H" level. When column select control signal 43 rises to an "H" level, column address counter 44 selects column select line 8a. When column select line 8a rises to an "H" level, column select gates 19a and 19b both become conductive, and bit line pair 15a and 15b and IO line pair 21a and 21b are connected to each other.

Since write driver 49 pulls down potential of one of IO line pair 21a and 21b to ground potential in response to data of write data bus 48, potential of one of bit line pair 15a and 15b is simultaneously pulled down to ground potential.

When column select control signal 43 falls to an "L" level, column select line 8a is set to a non-selected state, transfer gates 19a and 19b become non-conductive, and bit line pair 15a and 15b and IO line pair 21a and 21b are not connected to each other.

However, since bit line loads 17a and 17b are non-conductive, potential difference between bit lines is held as it has been even if bit line pair 15a and 15b and IO line 21a and 21b are not connected to each other.

In the next cycle, if write enable signal 60 is at an "L" level at a rising edge of external clock signal 58, write data input 46 is taken into input buffer 47. Input buffer 47 outputs write data to write data bus 48.

When column select control signal 43 rises to an "H" level, column address counter 44 selects column select line 8b. When column select line 8b rises to an "H" level, transfer gates 20a and 20b turn on and bit line pair 16a and 16b and IO line pair 21a and 21b are connected to each other.

Since write driver 49 pulls down potential of one of IO line pair 21a and 21b to ground potential corresponding to data of write data bus 48, potential of one of bit line pair 16a and 16b is simultaneously pulled down to ground potential.

When column select control signal 43 falls to an "L" level, column select line 8b is set to a non-selected state, column select gates 20a and 20b become non-conductive, and bit line pair 16a and 16b and IO line pair 21a and 21b are not connected to each other.

However, since bit line loads 18a and 18b are non-conductive, potential difference between bit lines is held as it has been even if bit line pair 16a and 16b and IO line pair 21a and 21b are not connected to each other.

If word line activation signal 42 rises to an "H" level at the time when write data is stored in bit line pairs 15a, 15b and 16a, 16b, row address decoder 3 selects word line 13a or 13b corresponding to row address signal 1.

Assume that word line 13a is selected, for explanation. When word line 13a rises to an "H" level, memory cells 14a and 14b are activated, and write data which has been stored temporarily in bit line pairs 15a, 15b and 16a, 16b is written to memory cells 14a and 14b, respectively.

Although 2-bit continuous write operation has been described, increase in the number of columns will enable further continuous write operation.

As has been described above, externally synchronized continuous read operation (burst read) and continuous write operation (burst write) with small power consumption can be implemented by the present invention. Although 2-bit continuous read and write operations have been described for convenience in this embodiment, increase in the number of columns will enable further continuous read and write operations.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which electrical rewriting of data is possible, comprising:
   a plurality of memory cells arranged in row and column directions;
   a word line provided corresponding to each row of memory cells;
   a complementary bit line pair provided corresponding to each column of memory cells;
   a sense amplifier including a complementary input node pair for amplifying potential difference between the input node pair;
   a transfer gate provided between said bit line pair and said input node pair of said sense amplifier;
   sensing means for sensing that a complementary output of said sense amplifier has been established; and
   a tristate buffer controlled by an output of said sensing means for outputting an output of said sense amplifier to a data bus.

2. The semiconductor memory device according to claim 1, wherein
   said sense amplifier is a latch type sense amplifier including
   first and second transistors of a first conductivity type having their first and second electrodes connected between one of said input node pair and a first reference potential line and between another of said input node pair and said first reference potential line, and their input electrodes connected to said another input node and said one input node, respectively, and
   first and second transistors of a second conductivity type having their first and second electrodes connected between one of said input node pair and a second reference potential line and between another of said input node pair and said second reference potential line, and their input electrodes connected to said another input node and said one input node, respectively.

3. The semiconductor memory device according to claim 1, wherein
   said sensing means is an AND circuit which receives a complementary output of said sense amplifier.

4. The semiconductor memory device according to claim 1, comprising:
   read control means for activating a desired memory cell by setting said word line to a selected state, writing potential difference corresponding to data of the memory cell to said input node pair of said sense amplifier, then, cutting off said transfer gate, activating said sense amplifier, and deactivating said memory cell by setting said word line to a non-selected state in response to an output of said sensing means.

5. A method of reading data of a memory cell in a semiconductor memory device including
   a plurality of memory cells arranged in row and column directions,
   a word line provided corresponding to each row of memory cells,
   a complementary bit line pair provided corresponding to each column of memory cells,
   a sense amplifier having a complementary input node pair for amplifying potential difference between the input node pair,
   a transfer gate provided between said bit line pair and said input node pair of said sense amplifier,
   sensing means for sensing that a complementary output of said sense amplifier has been established, and
   a tristate buffer controlled by an output of said sensing means for outputting an output of said sense amplifier to a data bus, comprising the steps of:
   activating a desired memory cell by setting said word line to a selected state, writing potential difference corresponding to data of the memory cell to the input node pair of said sense amplifier, then, cutting off said transfer gate, activating said sense amplifier, and deactivating said memory cell by setting said word line to a non-selected state in response to an output of said sensing means.

6. A method of continuously reading data of a desired row of memory cells in a semiconductor memory device having
   a plurality of memory cells for storing data arranged in row and column directions,
   a word line provided corresponding to each row of memory cells, a complementary bit line pair provided corresponding to each column of memory cells, a selectively activated bit line load provided corresponding to each complementary bit line pair, each bit line load being connected between a bit line pair and a power supply terminal of the semiconductor memory, read means for reading data of a desired memory cell, and a column select gate provided corresponding to each bit line pair, for connecting a bit line pair to which a desired memory cell is connected and said read means to each other, said method comprising the steps of:

applying a signal to each bit line load for causing each complementary bit line pair to be in a floating state;

applying a signal having a prescribed period to a word line corresponding to the desired row, and during said prescribed period, storing the data of each memory cell of said desired row in a floating bit line pair to which each memory cell is connected, wherein said data is stored simultaneously in each bit line pair; and thereafter, sequentially applying a signal to each column select gate for successively connecting and disconnecting each bit line pair, one by one, to and from said read means, wherein potential differences stored in the bit line pairs are continuously transferred to and amplified by said read means;

whereby the word line is rendered conductive only once and data is read continuously, so that a burst read operation is implemented.

7. A method of simultaneously writing data to a desired row of memory cells in a semiconductor memory device having a plurality of memory cells for storing data arranged in row and column directions, a word line provided corresponding to each row of memory cells, a complementary bit line pair provided corresponding to each column of memory cells, a switched bit line load provided corresponding to each complementary bit line pair, each load being connected between a bit line pair and a power supply terminal of the semiconductor memory, write means for writing data to a desired memory cell, and a column select gate provided corresponding to each bit line pair, for connecting a bit line pair to which a desired memory cell is connected and said write means to each other, said method comprising the steps of:

applying a signal to each bit line load for causing each complementary bit line pair to be in a floating state;

sequentially applying a signal to each column select gate for successively connecting and disconnecting, one by one, each floating bit line pair to and from the write means, wherein write data is continuously transferred from said write means to each floating bit line pair; and thereafter, applying a signal having a prescribed period to a word line corresponding to the desired row, and during said prescribed period, writing the data of each bit line pair to each memory cell of said desired row, wherein said data is written simultaneously into each desired memory cell;

whereby data is written to said bit line pairs continuously, and the word line is rendered conductive only once, so that a burst write operation is implemented.

* * * * *